(12) United States Patent
Kolluru et al.

(10) Patent No.: US 9,891,269 B2
(45) Date of Patent: Feb. 13, 2018

(54) PULSED TESTING OF THROUGH-BODY-VIAS

(75) Inventors: Kalyan C. Kolluru, Portland, OR (US); Mladenko Vukic, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 226 days.

(21) Appl. No.: 13/977,655

(22) PCT Filed: Jun. 29, 2012

(86) PCT No.: PCT/US2012/045097
§ 371 (c)(1),
(2), (4) Date: Feb. 18, 2015

(87) PCT Pub. No.: WO2014/003792
PCT Pub. Date: Jan. 3, 2014

(65) Prior Publication Data
US 2015/0160289 A1    Jun. 11, 2015

(51) Int. Cl.
*G01R 31/28* (2006.01)
*H01L 25/065* (2006.01)
*H01L 21/66* (2006.01)
*G01R 31/312* (2006.01)
*H01L 23/48* (2006.01)

(52) U.S. Cl.
CPC ....... *G01R 31/2851* (2013.01); *G01R 31/312* (2013.01); *H01L 22/14* (2013.01); *H01L 25/0657* (2013.01); *G01R 31/2853* (2013.01); *H01L 23/481* (2013.01); *H01L 2224/131* (2013.01); *H01L 2224/13025* (2013.01); *H01L 2224/16146* (2013.01); *H01L 2224/16225* (2013.01); *H01L 2224/16227* (2013.01)

(58) Field of Classification Search
CPC .................. G01R 31/2851; G01R 31/2853
USPC ....................... 324/762.01–762.03
See application file for complete search history.

(56) References Cited

U.S. PATENT DOCUMENTS 3,761,805 A * 9/1973 Dornberger ........ G01R 27/2605
324/617
4,825,147 A * 4/1989 Cook
(Continued)

FOREIGN PATENT DOCUMENTS

KR    10-2005-0066851    6/2005
KR    10-2011-0042901    4/2011

OTHER PUBLICATIONS

Chen, P., et al., "On-Chip Testing of Blind and Open-Sleeve TSVs for 3D IC before Bonding", Proceedings of the 2010 28th IEEE VLSI Test Symposium, 2010, 6 pp.
(Continued)

*Primary Examiner* — Walter L Lindsay, Jr.
*Assistant Examiner* — Milton Gonzalez
(74) *Attorney, Agent, or Firm* — Konrad Raynes Davda & Victor LLP

(57) ABSTRACT

An integrated circuit die has one or more through-body-vias and a testing circuit on board the die which tests for defects in a through-body-via by driving of pulses of current into a node. Pulses are counted until the voltage of the node reaches a threshold voltage to provide a pulse count which is a function of the capacitance of the node. A determination is made as to whether the through-body-via of the node has a defect as a function of the pulse count.

21 Claims, 9 Drawing Sheets

(56) References Cited

U.S. PATENT DOCUMENTS

| | | | | |
|---|---|---|---|---|
| 7,667,468 | B1* | 2/2010 | Anderson | G01D 5/24 324/676 |
| 8,154,310 | B1* | 4/2012 | Maharyta | G06F 3/0416 324/678 |
| 8,531,193 | B2* | 9/2013 | Valisuo | G01D 5/24 324/663 |
| 2009/0243631 | A1* | 10/2009 | Kuang | G01R 27/2605 324/658 |
| 2010/0102831 | A1* | 4/2010 | Kuang | G01R 27/2605 324/676 |
| 2011/0080184 | A1 | 4/2011 | Wu et al. | |
| 2012/0025846 | A1 | 2/2012 | Minas et al. | |
| 2012/0153280 | A1 | 6/2012 | Kim et al. | |
| 2013/0001548 | A1* | 1/2013 | Jeong | |

OTHER PUBLICATIONS

Cho, M., et al., "Design Method and Test Structure to Characterize and Repair TSV Defect Induced Signal Degradation in 3D System", Proceedings of the 2010 IEEE/ACM International Conference on Computer-Aided Design (ICCAD), Nov. 2010, 4 pp.

Tsai, M., et al., "Through Silicon Via (TSV) Defect/Pinhole Self Test Circuit for 3D-IC", Proceedings of the 2009 IEEE International Conference on 3D System Integration, Sep. 2009, 8 pp.

Wikipedia, "3DS (Die Stacking)", [online], last modified Dec. 17, 2011, [Retrieved on Feb. 8, 2012], Retrieved from the Internet at <URL: http://en.wikipedia.org/wiki/3DS_(die_stacking)>, 2 pp.

International Preliminary Report on Patentability for International Application No. PCT/US2012/045097, dated Jan. 8, 2015, 8 pp.

International Search Report and Written Opinion for International Application No. PCT/US2012/045097, dated Mar. 4, 2013, 11 pp.

* cited by examiner

PULSED TESTING OF THROUGH-BODY-VIAS

BACKGROUND

Description of Related Art

Integrated circuits typically include various active and passive circuit elements which have been integrated into a piece or substrate of semiconductor material, often referred to as a die. The die may, in turn, be fully or partially encapsulated into a package, which often includes a ceramic or plastic substrate although other materials may be used. The package mechanically supports and protects the die which is often relatively fragile.

These packages are usually attached to a printed circuit board through their second level interconnects, which often are pins, balls or other connectors arranged along the exterior of the package. The package may be attached directly to the printed circuit board, often by soldering or other connection techniques. In some applications, the package may not connect directly to the printed circuit board. Instead, an interposer or socket or other device may provide an intermediate connection between the package and the printed circuit board.

Conductors of the package typically provide separate electrical connection terminals between the printed circuit board (or interposer or socket), and the various inputs and outputs of the integrated circuit or circuits within the package. An integrated circuit die often has electrical connectors such as solder bumps to mechanically and electrically connect the integrated circuit die to the package substrate. Solder bumps or other electrical connectors may also be used to mechanically and electrically connect an integrated circuit die to one or more other such dies in a stack arrangement. In this manner, an electronic system can be formed by connecting various integrated circuit dies to a printed circuit board.

Before an integrated circuit die is placed in a package or in a stack of dies, the die is often tested. A process in which a die on a wafer is tested is commonly referred to as "wafer sort." Wafer sort testing may occur at various stages of die processing. One such testing stage may occur after the front side of the wafer or die is processed. The side of the die on which the integrated circuit is formed is typically referred to as the front side of the die. Another testing stage may occur after processing of the back side of the wafer or die. Formation of metal conductors in signal redistribution layers on the back side of the die is often referred to as back side processing.

Wafer sort testing typically involves the use of probing technology wherein mechanical probes extending from a probe engage electrical contact features on a die, and connect the contact features to a tester of a testing apparatus. During testing, a handler is frequently used to support the wafer on a platform or chuck and positions the wafer so as to precisely align the die bumps, bond pads or other electrical contact features of a die to be tested with the probe features on the probe card.

A staging device typically positions the chuck along an x-y plane by moving along a stage floor on an actuator assembly such as a ball screw stage assembly or magnetic air bearing, for example. The chuck typically comprises a vacuum chuck wherein the wafer being tested is held in position by drawing a vacuum within a plurality of interconnecting channels that are formed within the surface of the chuck. Once aligned, the chuck is raised via rods such that the contact features of the die are forced against the probe features on the probe card.

To activate the circuitry on the die, power signals including voltage and ground signals, and input signals including control, address, clock and data signals are supplied to die bumps, bond pads or other electrical contact features of a die which may be positioned on the front side, back side, or both sides of the device. Signals generated by the integrated circuit device in response to the supplied signals may be received by probes of the probe card and may be recorded and analyzed by the tester.

An integrated circuit device packaged in a package may be tested as a whole by plugging the device into a test socket of a test board which provides suitable test signals to the input pins of the device to test the operation of the device. Signals generated by the device in response to the supplied signals may be received by the test socket from the output pins and may be recorded and analyzed by the test board.

BRIEF DESCRIPTION OF THE DRAWINGS

Referring now to the drawings in which like reference numbers represent corresponding parts throughout:

FIG. 7b is a graph illustrating an example of the pulse integration operation of FIG. 7a;

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

In accordance with one aspect of the present description, through-body-vias such as through-silicon-vias, for example, may be tested for defects in a pulse integration process which includes driving pulses of current into a circuit feature such as an input/output circuit which includes a through-body-via, comparing the voltage of the through-body-via circuit feature to a threshold voltage, and counting the pulses of current until the voltage of the through-body-via circuit feature reaches the threshold voltage. As explained in greater detail below, such a test may be utilized in determining whether the through-body-via has a defect such as an open condition, for example.

Figure 1:
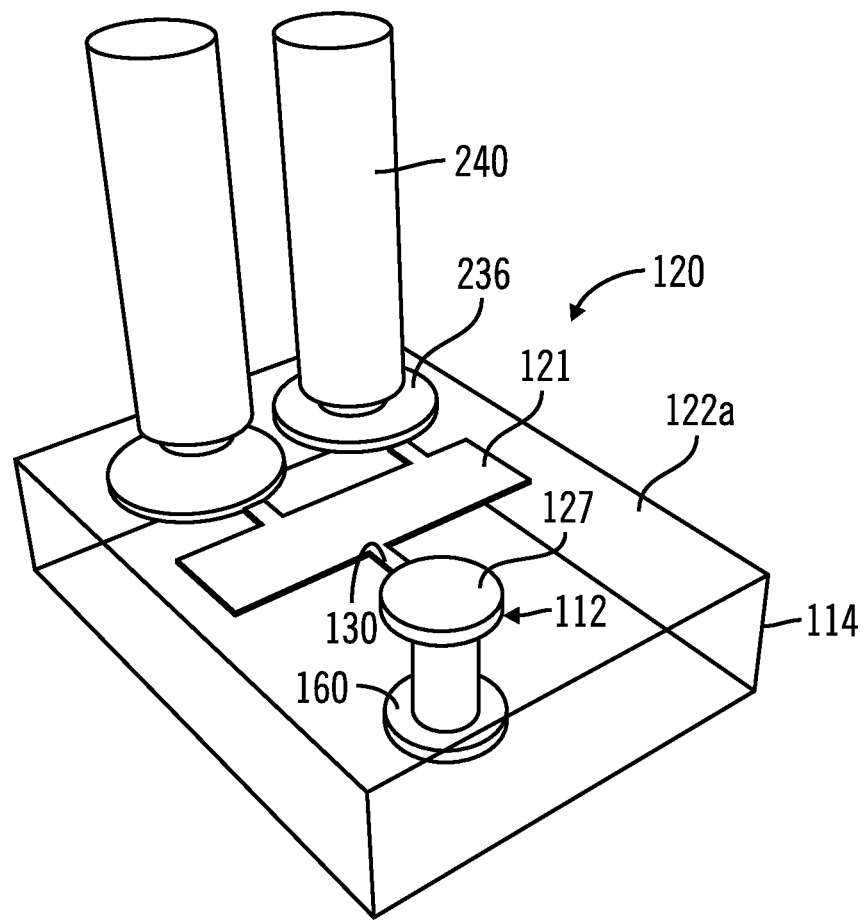
FIG. 1 illustrates one embodiment of a die having a through-body-via and a through-body-via testing circuit in accordance with the present description.

FIG. 1 is a schematic diagram depicting one example of a portion of a die 120 having a through-body-via 112 and an on board integrated through-body-via testing circuit 121 in accordance with the present description, which may be utilized in determining whether the through-body-via has a defect such as an open condition, for example. Although one through-body-via 112 is depicted, it is appreciated that a die may have tens, hundreds or more such through-body-vias, depending upon the application.

The through-body-via 112 is conductive and passes vertically through the body 114 of a die 120 from the front side 122a (FIG. 2) of the die to the back side 122b of the die 120. Each through-body-via 112 is generally cylindrical (three-dimensional) in shape and is formed by depositing a conductive metal in a cylindrically-shaped passageway which passes from the front side 122a of the die to the back side 122b of the die 120. It is appreciated that a through-body-via may have other shapes, depending upon the particular application.

In FIG. 1, the semiconductor material 125 (FIG. 2) of the die 120 has been omitted for clarity. In the illustrated embodiment, the semiconductor material 125 is silicon such that the through-body-via 112 is a through-silicon-via. However, it is appreciated that the body of a die may be made of other types of materials including semiconductor materials such as germanium and non-semiconductor materials.

Figure 2:
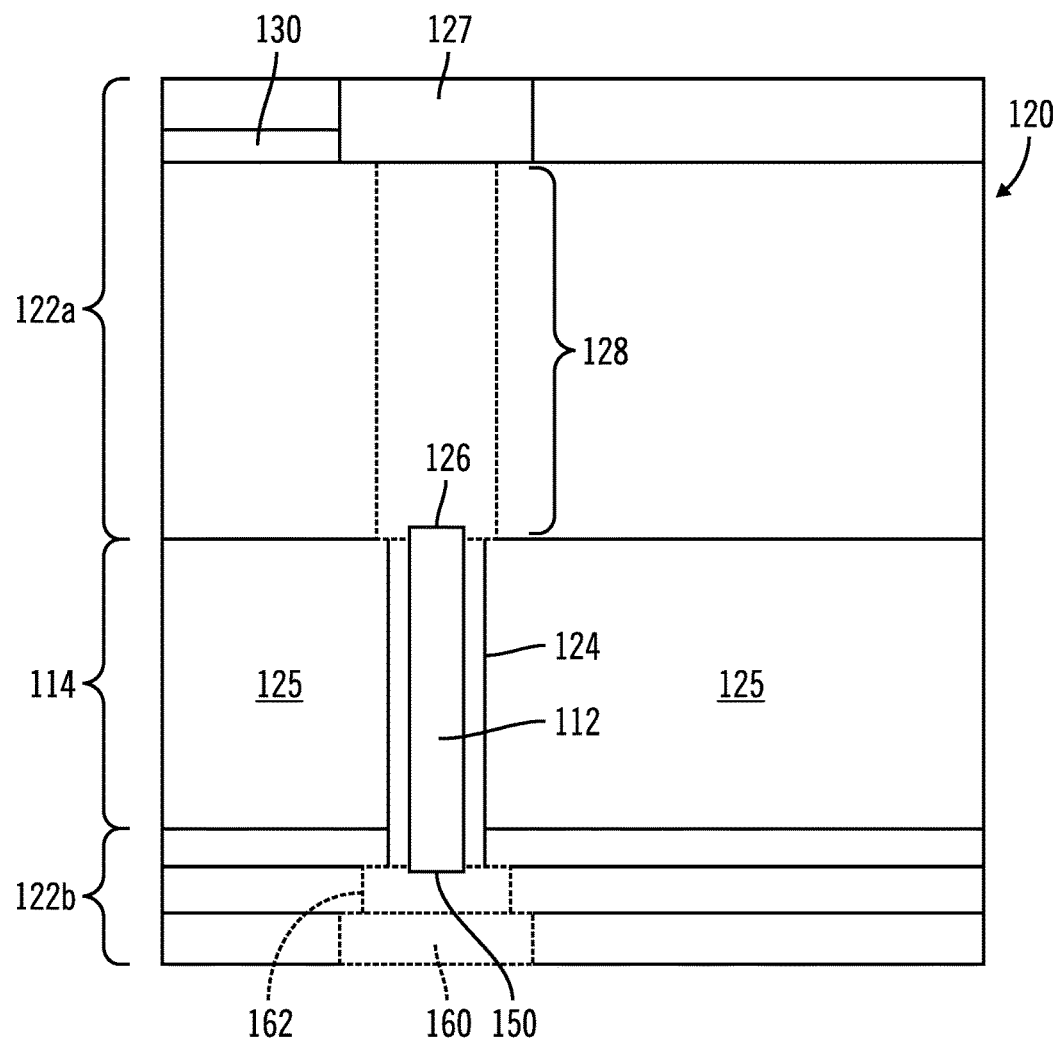
FIG. 2 is a cross-sectional view of the through-body-via of FIG. 1.

As shown in FIG. 2, a barrier/liner layer 124 may be deposited of suitable barrier or liner (or both) materials, on the walls of the passageway in the body 114, and between the semiconductor material 125 of the body 114 and the conductive material of the through-body-via 112. An example of such a barrier/liner layer 124 is a dielectric or insulative layer such as silicon dioxide, for example. It is appreciated that other materials may be used, depending upon the particular application.

In the illustrated embodiment, the body 114 of the die 120 includes the bulk crystalline silicon portion of the silicon die 120, and doped semiconductor regions of integrated circuits formed on the die 120. It is appreciated however, that in some embodiments, such as in silicon interposers, for example, the die 120 may lack any active components. The front side 122a of the die 120 is supported by the front side of the body 114, and includes deposited metallization layers separated by deposited insulation layers. Vias formed through the insulation layers are used to interconnect the metallization layers of the integrated circuits.

An integrated circuit typically has many metal interconnect layers which are interconnected with vias of typically nanometer dimensions. Advanced integrated circuits can have in excess of 10 levels of interconnect metal layers on the front side of the die. These are typically referred to as M1, M2, . . . M10, etc. where M1 is metal layer closest to the transistors while M10 (or higher) is the metal layer closest to the exterior of the die.

In this embodiment, a plurality of conductors 128 deposited in metallization and insulation layers on the front side 122a of the die, electrically couples the front side end 126 of the through-body-via 112, to a contact pad conductor 127 and to a conductor 130 on the front side 122a of the die. The conductors 128 may take any suitable form. For example, the conductors 128 may include conductive metal plates formed in a metallization layer, and conductive metal through-layer-vias formed in an insulation layer separating adjacent metallization layers. The conductors 128 connect to each other to pass current between the front side end 126 of each through-body-via 112, to the contact pad conductor 127 which may be used to connect to dies or other circuits external to the die 120, for example. The conductor 130 on the front side of the die 120 may couple the through-body-via 112 to the testing circuit 121 and to other circuits on the front side 122a of the die 120 such as an I/O buffer, for example. The arrangement of conductors on the front side of the die associated with the through-body-via may vary, depending upon the particular application. For example, in some applications, a through-body-via may lack a front side contact pad conductor 127.

The back side 122b of the die 120 is supported by the back side of the body 114, and similarly includes deposited metallization layers separated by deposited insulation layers. Conductors formed in the metallization layers and through the insulation layers on the back side 122b are used to redistribute signals to or from the integrated circuits on the die 120.

A back side end 150 of the through-body-via 112 is electrically coupled to a back side contact pad conductor 160 by a conductor 162 formed by metallization traces on the back side 122b of the die 120. The metallization traces of the conductors may be formed in one or more redistribution layers on the back side 122b of the die 120. In the illustrated embodiment, the contact pad conductors 127, 160 electrically coupled to the through-body-via 112, may be coaxially aligned with the through-body-via 112, or may be offset with respect to the through-body-via 112, depending upon the particular application.

In one application, the through-body-via 112 may be coupled to an I/O buffer on the front side of the die 120 and the contact pad conductor 160 may function as a contact pad for the I/O buffer. As explained in greater detail below, the I/O buffer forms a part of the testing circuit 121 in the illustrated embodiment. It is appreciated that the through-body-via 112 may be coupled to other types of circuitry on the die, depending upon the particular application.

Figure 3:
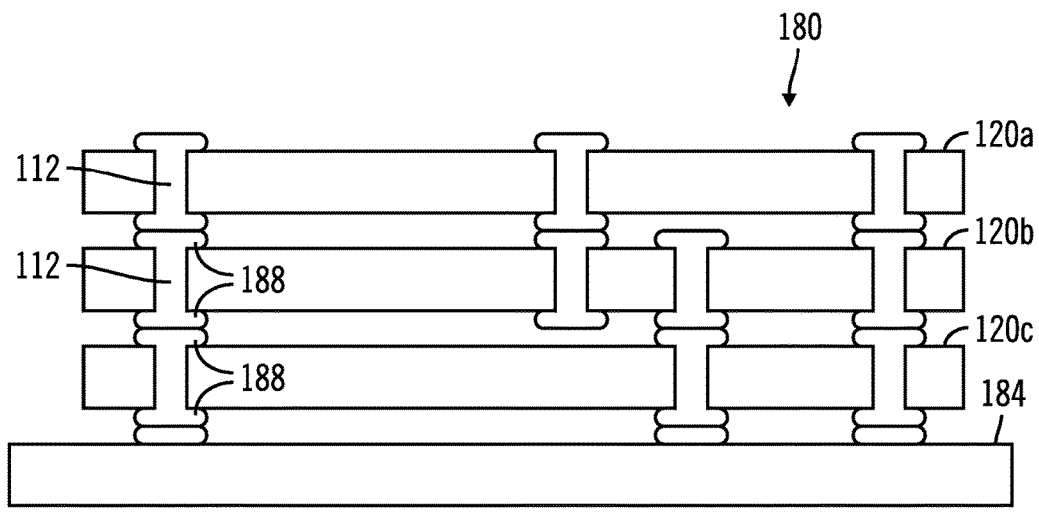
FIG. 3 illustrates one example of a stack of dies having through-body-via testing circuits in accordance with the present description.

FIG. 3 shows one example of a stack 180 of interconnected dies 120a, 120b, 120c, 184 which may have any suitable integrated circuits including processors, memory, and input/output circuits. In this example, the dies 120a, 120b, 120c are similar to the die 120 of FIG. 2, and thus each die 120a, 120b, 120c has a plurality of through-body-vias 112 with associated front side and back side contact pad conductors similar to the contact pad conductors 127, 160 of FIG. 2.

The contact pad conductor of a through-body-via 112 of one die 120a, 120b, 120c may be electrically connected to a contact pad conductor of a through-body-via 112 of an adjacent die 120a, 120b, 120c of the stack 180 by suitable connectors such as solder balls 188. It is appreciated that other conductors may be used to electrically connect the through-body-vias 112 of the stack 180 together, depending upon the particular application. In the illustrated embodiment of FIG. 3, the through-body-vias 112 may be electrically connected to a coaxially aligned through-body-via 112 of an adjacent die, or may be electrically connected to an axially offset through-body-via 112 of an adjacent die, or may be electrically coupled to a die or die portion lacking a through-body-via as shown for the die 184, for example.

Also in the illustrated embodiment, the through-body-vias are depicted as interconnecting a stack of dies. It is appreciated that embodiments in accordance with the present description may have through-body-vias in other applications such as interconnecting a die to a package or package substrate, or other applications.

During the manufacturing process, it is recognized that, due to various factors, some through-body-vias such as through-silicon-vias, may be imperfectly formed such that one or more may contain defects such as shorts, pin holes, open circuits, or other defects. Thus, before the dies are assembled in a stack of dies or assembled in a package, dies are frequently tested to confirm the structural integrity and proper operation of various components of the devices formed in and on the die.

Various techniques have been used or proposed for testing die components such as through-body-vias. For example, it is believed that electrical shorts of through-silicon-vias may be tested with known on die input/output methods. Many of such tests are performed on a die by directly contacting conductor bumps, conductor contact pads, or other conductors on the die to input test signals and receive test data in return.

However, it is recognized herein that known testing techniques may not be well suited to testing some defects of through-silicon-vias, such as open circuit conditions of through-silicon-vias, for example. More specifically it is recognized herein that an appropriate test of an open circuit condition for a through-silicon-via may include a reliable estimation of pad capacitance of the through-silicon-via. However, because the "pitch", that is, the distance between adjacent through-silicon-vias may be quite small in many dies, direct probing of the through-silicon-via contact pads may be difficult to achieve. For example, the microprobes may be too large to readily contact individual through-silicon-via contact pads. Moreover, many through-silicon-vias are frequently relatively fragile. As a result, direct mechanical contact between a through-silicon-via contact pad and a probe may damage the contact pad.

Accordingly, it is recognized herein that an appropriate testing technique for a through-silicon-via or other through-body-via may avoid direct probing of the through-silicon-via contact pads. One approach to avoiding direct probing of a particular circuit or circuit element is to use testing circuitry formed on board the die. On-board testing circuitry, often referred to in general as design for test (DFT) circuitry, can in response to test input signals provided by a probe, input pin or other external conductor, provide test input signals to the die circuit or component to be tested. In addition, such on board testing circuitry can receive test output data in return which can be processed and output through a probe, output pin or other external conductor.

However, known testing interfaces typically do not have analog references, analog circuits, or compensations for driver strength. Also known testing interfaces typically lack sophisticated receivers and instead typically have simplistic receivers with hysteresis. As a result, it is believed that these known techniques for on-board testing of a die are not well suited for testing certain through-silicon-via defects such as an open circuit condition, for example.

In accordance with one aspect of the present description, testing circuitry on board a die provides for capacitance testing a through-body-via for a defect as a function of the capacitance of the through-body-via. In the illustrated embodiment, the capacitance testing includes a pulse integration process which comprises driving pulses of current into a circuit feature which includes the through-body-via, comparing the voltage of the through-body-via circuit feature to a threshold voltage, and counting the pulses of current until the voltage of the through-body-via circuit feature reaches the threshold voltage. As explained in greater detail below, the count of pulses provides a measure of the capacitance of the through-body-via and as such, may be utilized as a test for defects such as a through-body-via having an open condition, for example.

In the illustrated embodiment of FIGS. 1-3, each die 120, 120a, 120b, 120c has one or more on-board testing circuits 121 (FIG. 1) which perform capacitance testing of through-body-vias for defects. In the example of the die 120, a conductor 130 (FIGS. 1, 2) on the front side 122a of each die connects such a through-body-via testing circuit 121 to a vertical front side connector such as the conductor 128, to the through-body-via 112 to test the through-body-via 112 and its associated conductors 128, 130, 162 and conductor contact pads 127, 160.

A complex integrated circuit such as a microprocessor, or memory, for example, may have hundreds of circuits (or more) to be individually tested. Accordingly, testing of dies is often automated.

Figure 4:
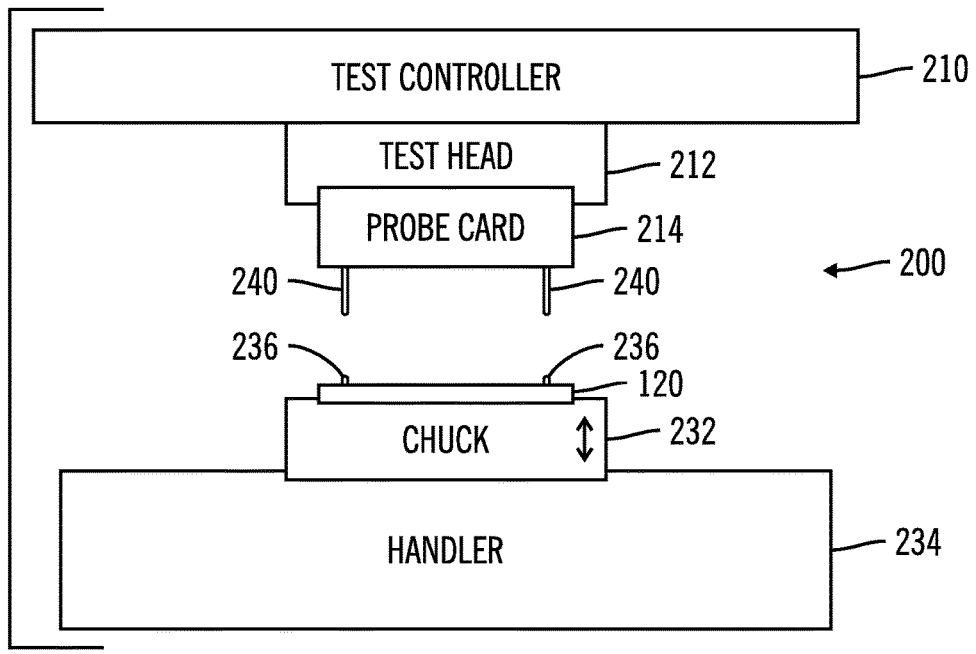
FIG. 4 schematically illustrates a testing apparatus for testing dies in accordance with one embodiment of the present description.

FIG. 4 depicts one example of an automated testing apparatus 200 in accordance with one embodiment of the present description. The testing apparatus 200 includes a test controller or tester 210, and a test head 212. A probe card 214 may be secured by the test head 212 which electrically couples the test controller 210 to the probe card 214. A die to be tested such as the die 120 is secured by a chuck 232 of a handler 234. The die may be part of a wafer or may have already been cut from the wafer. During testing, the handler 234 under the control of the test controller 210, positions the die so as to precisely align the die bumps, bond pads or other electrical contact features 236 of the die 120 with corresponding mechanical probes 240 of the probe card 214. At the start of the test process, the handler 232 raises the die 120 so that selected electrical contact features 236 of the die 120 physically contact and make electrical connection with corresponding mechanical probes 240 of the probe card.

In this embodiment, some of the mechanical probes 240 are used to supply power (e.g. voltage) and ground signals to the die 120. Thus, although two mechanical probes 240 are depicted in the schematic diagram of FIG. 4, an actual probe card may have hundreds of such mechanical probes for applying power and ground signals to a die 120 such as the die 120 shown in FIG. 5. Still further, many of the mechanical probes may be used to send test signals including test data and test control and timing signals to one or more die bumps or other electrical features on the die 120. Also, many of the mechanical probes may be used to receive test signals including test result data from one or more die bumps or other electrical features on the die 120. Such test operational data may include Joint Test Action Group (JTAG) signals, reset signals and clock signals, for example.

Figure 5:
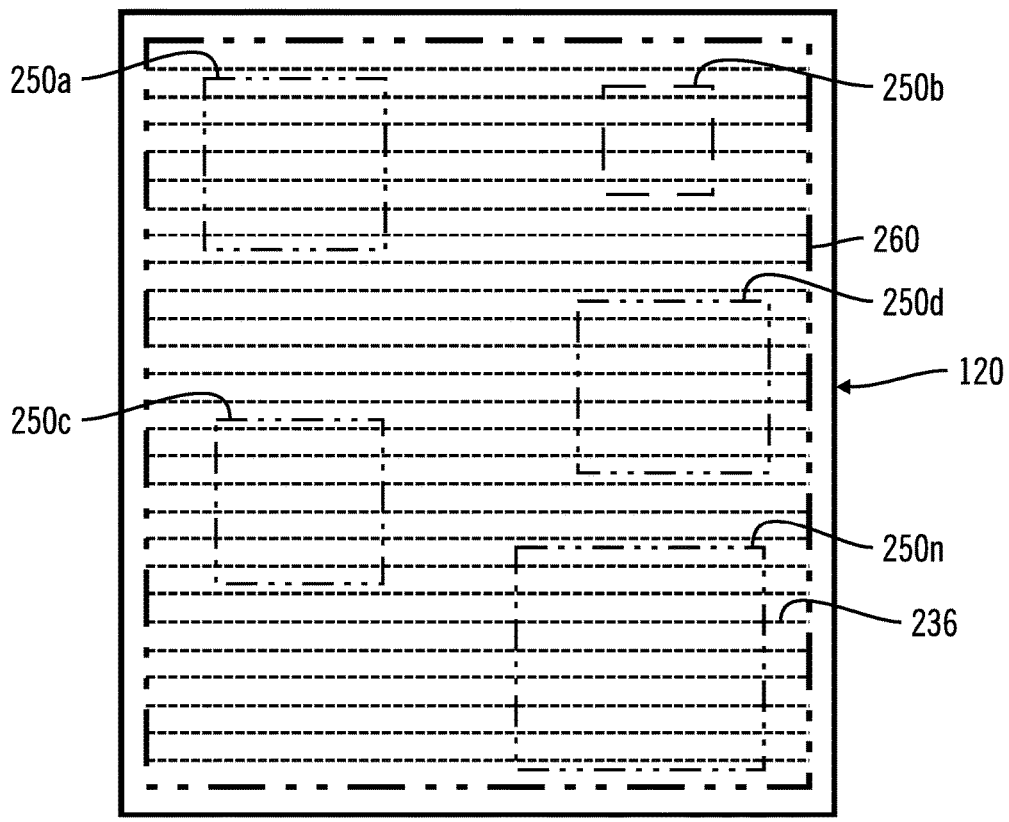
FIG. 5 is a schematic illustration of the front side of one embodiment of a die having a through-body-via testing circuit in accordance with the present description.

In the embodiment of FIG. 5, the die 120 has a number of separate circuit portions 250a, 250b . . . 250n which may include through-body-vias to be tested, where n may be in the tens, hundreds or more, in an active region 260. Accordingly, the die 120 may have hundreds of electrical contact features 236 such as die bumps to receive power, ground and test signals from the probes 240 of the probe card 214. Also, the die 120 may have many electrical contact features 236 such as die bumps to transmit test data signals to the probes 240 of the probe card 214. However, dies to be tested in other applications may have a greater or fewer number of electrical contact features, depending upon the particular application.

The through-body-via testing circuit 121 may be used to test one or more separate circuit portions 250a, 250b . . . 250n, many of which may include through-body-vias to be tested. Thus, one or more separate circuit portions 250a, 250b . . . 250n may share a through-body-via testing circuit 121. Thus, a die 120 may have one through-body-via testing circuit 121 or may have many through-body-via testing circuits 121 for testing the through-body-vias of the separate circuit portions 250a, 250b . . . 250n, depending upon the particular application.

In the illustrated embodiment, the separate circuit portions 250a, 250b . . . 250n may have one or more through-body-vias 112. However, it is appreciated that a capacitance testing circuit in accordance with the present description may be used to test circuit devices and structures, other than through-body-vias, depending upon the particular application.

In the illustrated embodiment, the through-body-via testing circuit 121 (FIG. 1) may include circuit portions such as I/O buffers which are used in normal operations of the circuitry of the die. The through-body-via testing circuit 121 (FIG. 1) may also include circuit portions which are used primarily to test the through-body-vias of the die 120 during one or more portions of the manufacturing process, such as during wafer sort testing, for example. Accordingly, a portion of through-body-via testing circuit 121 may not be intended to be used during normal operation of the die. Thus, if the die 120 is a memory die, for example, once the die 120 has been tested, attached to one or more other dies, and packaged, a portion of the testing circuit 121 may be covered by packaging and may not be operated again either by the manufacturer or by the consumer when using the die 120 to perform the memory function. It is appreciated however that in some applications, the entire through-body-via testing circuit 121 may be used in normal (non-testing) operations of the die 120.

Figure 6:
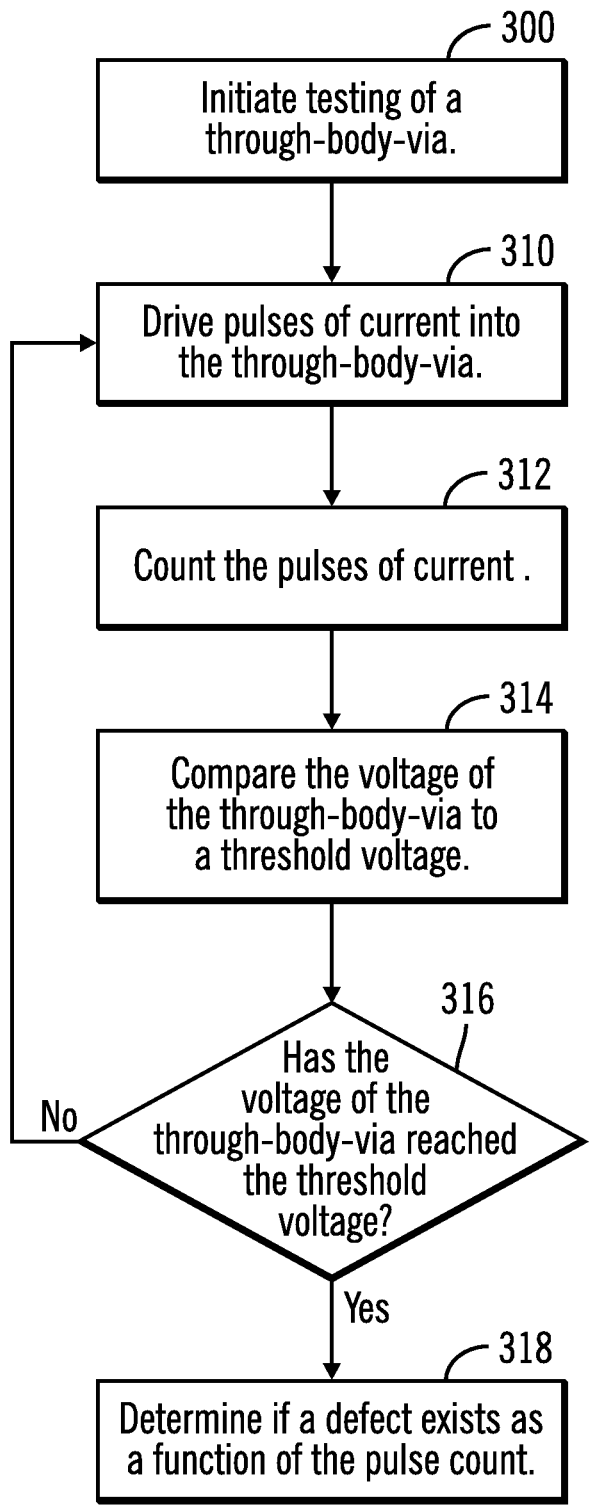
FIG. 6 illustrates operations in accordance with one embodiment for testing through-body-vias of a die in accordance with the present description.

FIG. 6 illustrates one embodiment of operations for testing a circuit of a die. In one operation, testing of a through-body-via is initiated (block 300). In the illustrated embodiment, the testing includes capacitance testing a through-body-via for a defect as a function of the capacitance of the through-body-via. The testing may be initiated by providing suitable test signals from an external test controller 210 (FIG. 4) to an internal test controller 302 (FIG. 7a) of the through-body-via testing circuit 121 through a mechanical probe 240 as depicted in FIG. 4. However, it is appreciated that testing may be initiated using other techniques such as providing suitable test signals to the through-body-via testing 121 through an external pin received in a test socket, for example. Other examples include internally generating test signals within the through-body-via testing 121 or other internal circuitry of the die to initiate testing in a self test. Other techniques may be used to initiate testing, depending upon the particular application.

Figure 7A:
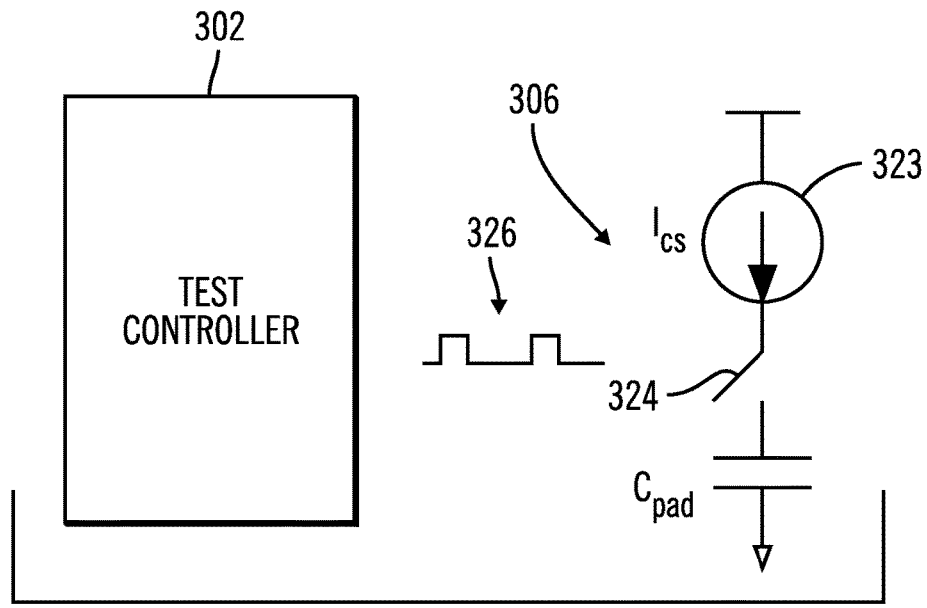
FIG. 7a is a schematic diagram illustrating an example of a pulse integration operation for an I/O pad in accordance with an operation of FIG. 6.

Upon initiation of testing, in a pulse integration process, pulses of current from a pulsed current source such as the pulsed current source 306 (FIG. 7a), for example, are driven (block 310) into the through-body-via 112 (FIG. 8), the capacitance of which is included in a node capacitance as represented by the capacitance $C_{pad}$ of FIG. 7a. It is recognized herein that there can be a correlation between a defect in a through-body-via and the number of pulses of current which may be applied to a node of the through-body-via being tested, in order for the voltage at that node to reach a threshold voltage. More specifically, it is recognized herein that there can be a correlation between a defect in a through-body-via and the capacitance value at a pad node of the through-body-via being tested. Furthermore, it is recognized herein that there can be a correlation between the capacitance value at a pad node of the through-body-via being tested, and the number of pulses of current which are applied until the voltage at that node reaches a threshold voltage. Thus, it is recognized herein that there can be a correlation between a defect in a through-body-via and the number of pulses of current which are applied to a node of the through-body-via being tested, for the voltage at that node to reach a threshold voltage.

The unknown capacitance can be estimated by integrating a known current over a period of time and measuring the output voltage:

$$i = C\frac{dV}{dT} \Rightarrow C = \frac{\int_0^{t_{vthr}} i\, dt}{\int_0^{V_{thr}} dV}$$

where the voltage rises from zero to a threshold voltage $V_{thr}$ over a time interval zero to $t_{vthr}$. If charging of a through-body-via node pad capacitance $C_{pad}$ is accomplished using a pulsed current source, this expression can be rewritten in the following form:

$$C_{pad} = \frac{\int_0^{t_{vtrh}} I_{cs}\, dt}{\int_0^{V_{thr}} dV} \approx \frac{\sum_0^{N_{cnt}} I_{cs}T_{pw}}{V_{thr}} \approx \frac{I_{cs}T_{PW}}{V_{thr}}N_{cnt} = K \cdot N_{cnt}$$

where $I_{cs}$ is the current of the current source, the width of each pulse is represented as $T_{PW}$, the number of current pulses applied for the voltage to reach the threshold voltage $V_{thr}$ is represented as $N_{cnt}$, and K is a proportionality constant. Thus, it is seen that the through-body-via node pad capacitance $C_{pad}$ and the pulse count $N_{cnt}$ are proportional.

Accordingly, in another operation of the testing process of FIG. 6, the pulses of current being applied to the through-body-via are counted (block 312) by a counter circuit such as the counter circuit 313 (FIG. 8), for example, as the voltage of the through-body-via is compared (block 314) by a detector such as the detector 315 (FIG. 8) to a threshold voltage. A determination is made as to whether (block 316) the voltage of the through-body-via has reached the threshold voltage. If not, additional pulses of current are applied (block 310). Once the voltage of the through-body-via has reached the threshold voltage, a determination may be made (block 318) as to whether a defect exists in the through-body-via as a function of the pulse count.

In the illustrated embodiment, the counts registered by the counter circuit may be stored by the test controller 302 (FIG. 7a) of the on board testing circuit 121 and forwarded to an external controller 210 (FIG. 4) for analysis. Alternatively, the test controller 302 of the on board testing circuit 121 may include suitable logic circuitry for determining whether a defect exists in the through-body-via as a function of the pulse count. The test controller 302 may be implemented in hardware, software, firmware or a combination thereof.

FIG. 7a shows an example of a suitable pulsed current source 306 which includes a current source 323 and a switch 324 responsive to a control pulse train 326 to provide a train 330 (FIG. 7b) of current pulses of current $I_{cs}$. This method for detection of a through-body-via defect such as an open through-silicon-via, is based on current integration on an unknown capacitance represented as $C_{pad}$ in FIG. 7a, which, in the illustrated embodiment, is measured at a node of an I/O buffer which includes a contact pad connected to a through-body-via.

Figure 7B:
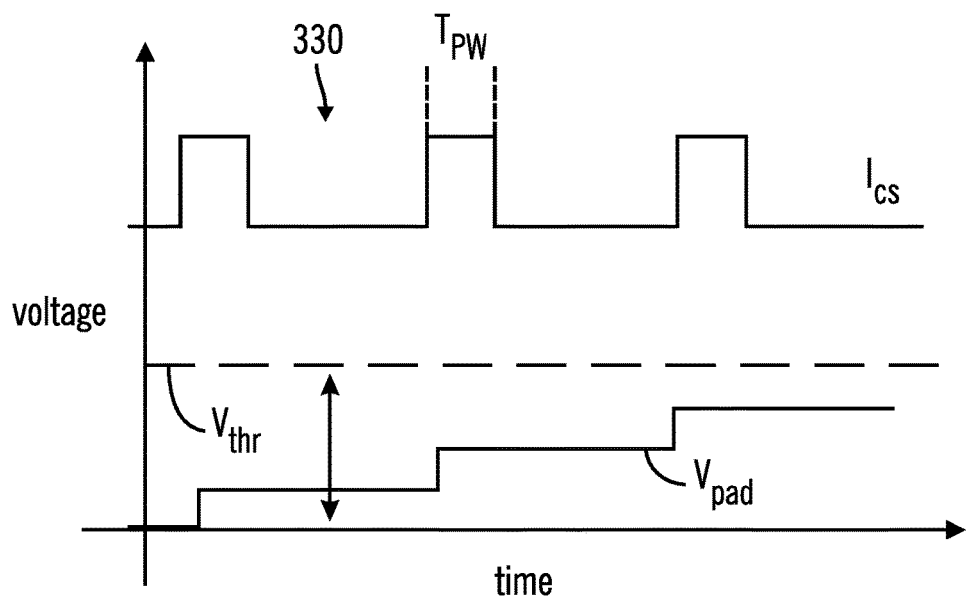

As shown in FIG. 7b, with each pulse of the current pulse train 330, a pulse of current $I_{cs}$ from the current source 323 is applied to the node which includes the through-body-via, such that the voltage at the node, which is represented as $V_{pad}$ in FIG. 7b, rises. Additional pulses of current of the current pulse train 330 may be applied until the voltage $V_{pad}$ reaches a threshold voltage $V_{thr}$. As previously mentioned, it is recognized herein that there is a correlation between the capacitance value $C_{pad}$ at the node which includes the through-body-via, and the number of pulses of current which are applied until the voltage $V_{pad}$ reaches the threshold voltage $V_{thr}$. This correlation may be represented as follows:

$$C_{pad}*V_{thr}=I_{cs}*T_{PW}*N_{cnt}$$

where the width of each pulse of the current pulse train 330 is represented as $T_{PW}$ and where the number of current pulses applied in order for the voltage $V_{pad}$ to reach the threshold voltage $V_{thr}$ is represented as $N_{cnt}$. Thus, it is seen that the capacitance $C_{pad}$ (which includes the capacitance of the through-body via) and the pulse count $N_{cnt}$ are proportional.

Figure 8:
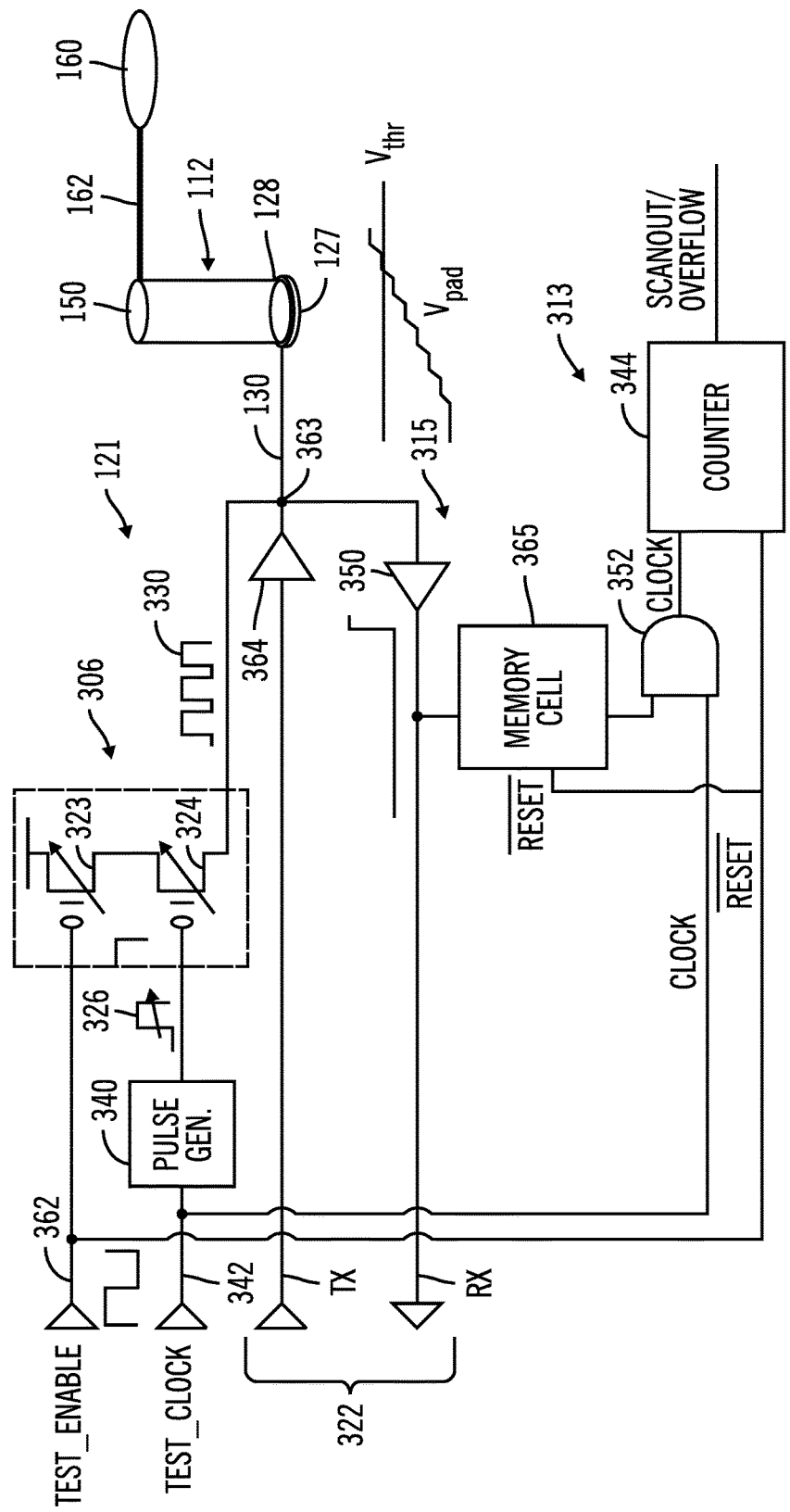
FIG. 8 illustrates one example of a through-body-via testing circuit in accordance with the present description, which includes an I/O buffer coupled to a through-body-via.

FIG. 8 shows one example of a through-body-via testing circuit 121 for a through-body-via 112 coupled to an I/O buffer 322 which includes a receiver circuit 350 and a transmitter circuit 364. A pulsed current source 306 of the through-body-via testing circuit 121 includes a weak pull-up current source 323 and a switch 324 operated by a control pulse train 326 output by a pulse generator 340 of the through-body-via testing circuit 121. In the illustrated embodiment, the weak pull-up current source 323 and switch 324 are MOS type transistors. It is appreciated that other types of transistors or devices may be used, depending upon the particular application.

In the illustrated embodiment, the test controller 302 (FIG. 7a) of the through-body-via testing circuit 121 provides suitable test control and timing signals to other circuitry of the testing circuit 121. Included in the test control and timing signals provided by the test controller 302 is a clock signal TEST_CLOCK, a control signal TEST_ENABLE, and a test data signal TX. The test data, control and timing signals may be generated in whole or in part by the test controller 302 upon initiation of a test or may be generated in whole or in part by an external controller such as the controller 210 (FIG. 4) and forwarded modified or unmodified by the on board test controller 302.

Figure 9A:
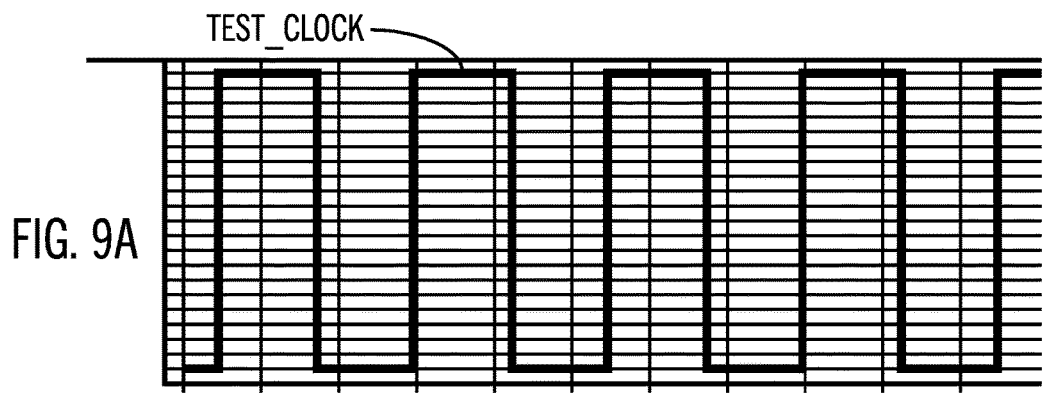
FIG. 9a-9d illustrates one example of timing of through-body-via testing operations in accordance with the operations of FIG. 6.
Figure 9B:
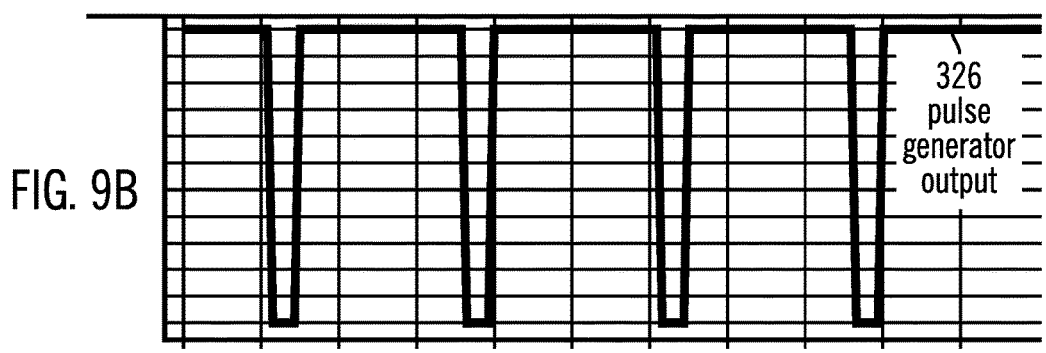
Figure 9C:
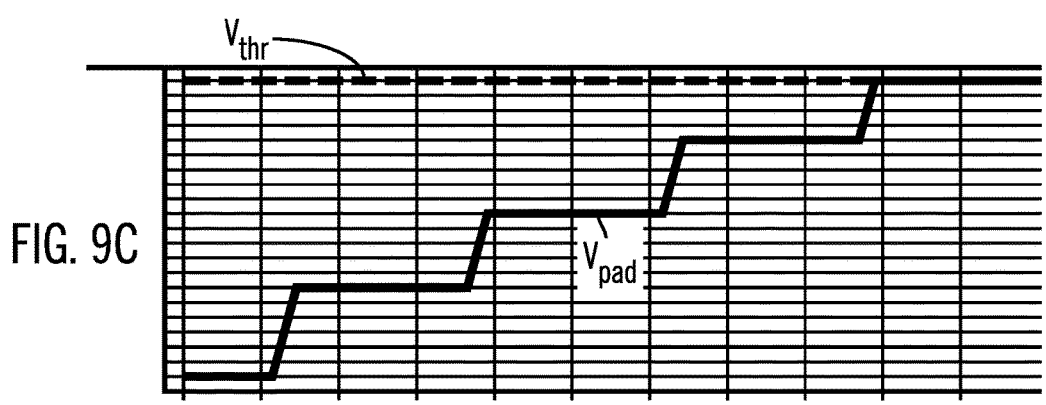

The pulse generator 340 in response to the clock signal TEST_CLOCK (FIG. 9a) at an input 342, issues a train of pulses 326 (FIG. 9b) in which each pulse switches the pulsed current source 306 to issue a pulse of the current pulse train 330 (FIG. 7b) to the node 363 which includes the conductor 130 and conductor pad 127 on the front side 122a (FIG. 2) of the die 120, as well as the through-body-via 112 and the conductor 162 and the conductor pad 160 on the back side of the die 120. The voltage $V_{pad}$ at the node 363 rises (FIG. 9c) with each pulse of the train of pulses 330 from the current source 306 due to the capacitance $C_{pad}$ exhibited with respect to the node 363. A counter 344 of a counter circuit 313 of the through-body-via testing circuit 121, counts the number of current pulses issued by the source 306, by counting the clock signals at input 342.

In the illustrated embodiment, the through-body-via testing circuit 121 includes a detector 315 which includes the receiver circuit 350 of the I/O buffer 322. The receiver circuit 350 has its input coupled to the node 363, and acts like a comparator for detecting when the voltage $V_{pad}$ at the conductor pad 127 crosses a voltage threshold level $V_{thr}$. In the illustrated embodiment, the detector 315 further includes a memory cell 365, which in the illustrated embodiment is a "sticky bit" flip-flop having an input coupled to the output of the receiver circuit 350. It is appreciated that other types of detectors may be used, depending upon the particular application. The RX output of the receiver circuit 350 changes from a logic "LOW" state to a logic "HIGH" state (FIG. 9d) when the voltage $V_{pad}$ at the conductor pad 127 crosses a voltage threshold level $V_{thr}$. The RX output of the receiver circuit 350 is stored by the memory cell 365 to provide an output of the detector 315.

The output of the detector 315 is received by a logic gate 352 of the counter circuit 313 which passes the clock signals at 342 to the counter 344 until the detector 315 detects that the voltage $V_{pad}$ at the conductor pad 127 crosses a voltage threshold level $V_{thr}$. At that point, the output of the detector 315 changes such that the logic gate 352 blocks further clock pulses so that the clock pulses are no longer received by the counter 344.

Prior to the start of the test, the test enable signal TEST_ENABLE at an input 362 of the testing circuit 121 is at a "LOW" logic state which resets the counter 344 and the memory cell 365 of the detector 315. The output of the sticky bit memory cell 365 stays at the logic "LOW" state until the logic state of the output of the receiver circuit 350 changes. At the same time, a test data signal TX at the TX input to the input transmitter circuit 364 actively drives low and discharges the node 363 which includes the through-body-via 112 to ground level. Consequently, the RX output of the receiver circuit 350 at the RX output is driven "LOW" (FIG. 9d) at the start of the test.

Figure 9D:
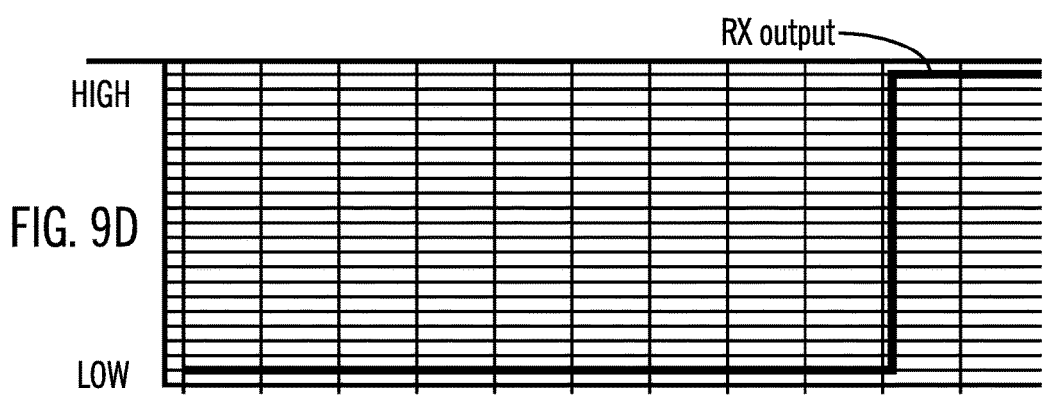

To initiate the pulsed integration portion of the test, the input transmitter circuit 364 is placed in a high impedance (HiZ) state and the TEST_ENABLE signal at 362 is asserted (logic HIGH). Consequently, the current source 306 is enabled and starts generating current pulses 330 (block 310, FIG. 6) based on the control pulses 326 (FIG. 9b) from the pulse generator 340. The current pulses 330 are driven into the node 363 and the voltage $V_{pad}$ starts to rise (FIG. 9c) as the counter 344 starts counting the number of clock signals which corresponds to the number of current pulses 330 generated. When the pad voltage $V_{pad}$ at the node 363 reaches the voltage threshold level $V_{thr}$ (FIG. 9c), the receiver circuit 350 transitions from the "LOW" logic state to the "HIGH" logic state (FIG. 9d). In addition, the counter circuit 313 is responsive to the output of the detector 315. Thus, when the pad voltage $V_{pad}$ at the node 363 reaches the voltage threshold level $V_{thr}$ and the receiver circuit 350 transitions from the "LOW" logic state to the "HIGH" logic state (FIG. 9d), the sticky-bit flip-flop memory cell 365 of the detector 315 is asserted such that the output of the detector 315 stops the pulse inputs to the counter 344. At that point, the count counted by the counter 344 represents the number of current pulses which drove the voltage $V_{pad}$ at the conductor pad 127 to the voltage threshold level $V_{thr}$. The output of the sticky bit memory cell 365 stays at the logic "HIGH" state and continues to stop the counter until the memory cell 365 is reset again. Thus, upon completion of the test, the final counter state of the counter 344 may be captured by the test controller 302 and analyzed internally or output to an external controller 210 through a suitable test data output such as a test access port (TAP) output.

In the illustrated embodiment, an open condition in the through-body-via itself or in the associated conductors to the I/O pad 160 is referred to collectively herein as an "open TBV" which results in a relatively small capacitance at the node 363. Conversely, a proper connectivity within the through-body-via itself and in the associated conductors to the I/O pad is referred to collectively as a "good TBV" which results in a relatively large capacitance at the node 363. It is appreciated however that current pulse testing in accordance with the present description may be applied to testing circuit features other than through-body-vias and may be applied to defects other than open conditions.

As previously mentioned, it is recognized herein that the capacitance of the through-body-via at the node 363 which includes the through-body-via 112 is proportional to the final counter state of the counter 344. It is further recognized that in the illustrated embodiment, the total capacitance $C_{pad}$ at the node 363 is a function of the capacitance of various conductors coupled to the node 363. Thus, in the illustrated embodiment, the total capacitance $C_{pad}$ at the at the node 363 is a function of the capacitance $C_{tx}$, that is, the capacitance of the transmitter circuit 364, the capacitance $C_{rx}$, that is, the capacitance of the receiver circuit 350, the capacitance $C_{esd}$, that is, the capacitance of diodes (not shown) for electro static discharge (ESD) protection, the capacitance $C_{inte}$, that is, the capacitance of connectors such as the conductors 127, 128, 130 on the front side 122a of the die 120, the capacitance $C_{tsv}$, that is, the capacitance of the through-body-via 112, the capacitance $C_{rd1}$, that is, the capacitance of the redistribution layer conductors such as the conductor 162, and the capacitance $C_{upad}$, that is, the capacitance of the pad 160 on the back side 122b of the die 120. Thus, the total capacitance $C_{pad}$ at the node 363, may be represented as follow:

$$C_{pad}=C_{tx}+C_{rx}+C_{esd}+C_{inte}+C_{tsv}+C_{rd1}+C_{upad}$$

These contributions can be grouped into two components:

$$C_{pad}=C_{i/o}+C_{tsv\_tot}$$

where $C_{i/o}=C_{tx}+C_{rx}+C_{esd}+C_{inte}$, and $C_{tsv\_tot}=C_{tsv}+C_{rd1}+C_{upad}$.

It is recognized herein that the capacitance $C_{i/o}$ represents those capacitive components which are typically substantially independent of defects that may be caused by defects of the processing which forms the through-body-via itself. Thus, it is recognized herein that the front side capacitive components made of the capacitance of the transmitter circuit 364 ($C_{tx}$), the capacitance of the receiver circuit 350 ($C_{rx}$), the capacitance $C_{esd}$, that is, the capacitance of diodes ($C_{esd}$) for electro static discharge protection, and the capacitance of connectors such as the conductors 127, 128, 130 ($C_{inte}$), on the front side 122a of the die 120, are typically substantially independent of defects that may be caused by defects of the processing which forms the through-body-via itself.

It is further recognized that the existence and proper operability of those components which contribute to the capacitance $C_{i/o}$ may be confirmed using known testing techniques. Thus, the existence and operability of the I/O buffer 322 and its receiver circuit 350 and its transmitter circuit 364 may be confirmed using known testing techniques. Similarly, existence and operability of the conductors 127, 128, 130 ($C_{inte}$), on the front side 122a of the die 120 may be confirmed using known testing techniques.

Conversely the capacitance $C_{tsv\_tot}$ represents the capacitances of those components which are more likely to be affected by defects caused by the processing which forms the through-body-via 112 as well as the redistribution layer and contact pad 160 on the back side 122b of the die. Thus, the capacitive components of the capacitance of the through-body-via 112 ($C_{tsv}$), the capacitance of the redistribution layer connector 162, and the capacitance of the connector pad 160, are believed to be more likely to be affected by defects caused by the processing which forms the through-body-via 112 as well as the redistribution layer and contact pad on the back side 122b of the die.

Accordingly, an indication of a defect in those components contributing capacitance to the capacitance $C_{tsv\_tot}$ may be obtained by obtaining a measurement of the capacitance $C_{tsv\_tot}$. As previously mentioned the total capacitance $C_{pad}=C_{i/o}+C_{tsv\_tot}$ may be estimated by integrating a known current over period of time and measuring the output voltage. Since the existence and proper operability of those components which contribute to the capacitance $C_{i/o}$ of the I/O buffer may be confirmed using known testing techniques, a drop below the expected total capacitance $C_{pad}$ can indicate that the capacitance component $C_{tsv\_tot}$ of the through-body-via 112 may be missing or diminished, indicating a possible defect in the through-body-via 112 or the back-side conductors connected to the through-body-via 112.

To provide a basis for comparison of measurements of the total capacitance $C_{pad}$, a pulse integration test for an open TBV condition may, in accordance with the present description, be executed twice, a first time prior to the formation of the through-silicon-via such that the die has a known open TBV condition, and a second time after the formation of the through-silicon-via. If the test results do not show a sufficient increase in the total capacitance $C_{pad}$ from the first test to the second test, a possible open TBV condition is indicated.

Thus, in the illustrated embodiment, a test for open TBV conditions may be executed twice during the manufacturing process. At a first test, the front side processing will have typically taken place. However, through-body-via processing and redistribution layer processing will typically have not yet taken place. Thus, the total capacitance $C_{pad}$, when measured at the first test is expected to reflect the capacitance $C_{i/o}=C_{tx}+C_{rx}+C_{esd}+C_{inte}$, that is, the capacitive components of the capacitance of the transmitter circuit 364 ($C_{tx}$), the capacitance of the receiver circuit 350 ($C_{rx}$), the capacitance $C_{esd}$, that is, the capacitance of diodes ($C_{esd}$) for electro static discharge protection, and the capacitance of connectors such as the conductors 127, 128, 130 ($C_{inte}$), on the front side 122a of the die 120. However, the total capacitance $C_{pad}$, when measured at the first test is not expected to reflect the capacitance $C_{tsv\_tot}=C_{tsv}+C_{rd1}+C_{upad}$, that is, the capacitive components of the capacitance of the through-body-via 112 ($C_{tsv}$), the capacitance of the redistribution layer connector 162, and the capacitance of the connector pad 160, since the through-body-via 112 as well as the redistribution layer and contact pad on the back side 122b of the die have not yet been formed at the first test. Accordingly, the physical state of the node 363 is lacking a through-body-via 112 at the first test.

As set forth above, it is seen that the through-body-via node pad capacitance $C_{pad}$ for an I/O buffer is proportion to the total pulse count $N_{cnt}$ (that is, $C_{pad}$,= and $K*N_{cnt}$). Accordingly, the pulse count for the through-body-via node pad capacitance $C_{pad}$ for each I/O buffer 322 at the first test is expected to correspond to the count of an I/O buffer with an open TBV. The results of the first test (pulse counts) for all the I/O buffers which will have through-body-vias are saved by the controllers 302, 210 and forwarded for use at the subsequent (second) test stage. Accordingly, the results at the first test will provide baseline results for comparison purposes for determination of an open TBV condition during the second test portion.

At the second test, the through-body-via processing as well as the back side processing will have typically taken place. Accordingly, the total capacitance $C_{pad}$, when measured at the second test is expected to reflect the capacitance $C_{pad}=C_{i/o}+C_{tsv\_tot}$ where $C_{i/o}=C_{tx}+C_{rx}+C_{esd}+C_{inte}$, and $C_{tsv\_tot}=C_{tsv}+C_{rd1}+C_{upad}$. Thus, in addition to the capacitance, $C_{i/o}=C_{tx}+C_{rx}+C_{esd}+C_{inte}$, that is, the capacitive components of the capacitance of the transmitter circuit 364 ($C_{tx}$), the capacitance of the receiver circuit 350 ($C_{rx}$), the capacitance $C_{esd}$, that is, the capacitance of diodes ($C_{esd}$) for electro static discharge protection, and the capacitance of connectors such as the conductors 127, 128, 130 ($C_{inte}$), on the front side 122a of the die 120, the total capacitance $C_{pad}$, when measured at the second test is also expected to reflect the capacitance $C_{tsv\_tot}=C_{tsv}+C_{rd1}+C_{upad}$, that is, the capacitive components of the capacitance of the through-body-via 112 ($C_{tsv}$), the capacitance of the redistribution layer connector 162, and the capacitance of the connector pad 160, since the through-body-via 112 as well as the redistribution layer and contact pad on the back side 122b of the die are expected to have been formed at the second test. Thus, the physical state of the node 363 is changed at the time of the second test to include a through-body-via 112. Accordingly, the pulse count $N_{cnt}$ obtained for each I/O buffer 322 having a through-body-via is expected to correspond to the count $N_{cnt}$ of an I/O buffer with a good TBV.

The results of the test (pulse counts) for all I/O buffers being tested for good TBVs are saved by the controllers 302, 210 and compared to the corresponding the test (pulse counts) for all I/O buffers forwarded from the previous test stage. Should the comparison of test pulse counts at the first and second tests indicate little or no change in the pulse counts for a particular I/O buffer, an indication of an open TBV condition is provided. Such a comparison of test pulse counts may be made as a ratio, for example. Thus, if the ratio of the number of test pulse counts at the second test after though-body-via processing, to the number of test pulse counts at the first test (prior to through-body-via processing), is roughly 1, indicating little change, an open TBV condition for the through-body-via of the particular I/O buffer is indicated.

Conversely, if this ratio is substantially greater than one, the through-body-via may be considered to have passed the test. In the illustrated embodiment, an increase in the number of test pulse counts at the second test after though silicon via processing by 100% as compared to the number of test pulse counts at the first test (prior to through-body-via processing) corresponding to a ratio of roughly 2, indicates sufficiently large change, thereby indicating a properly formed or good TBV for the particular I/O buffer. A ratio or percentage change which is sufficiently large to warrant a pass may be determined by modeling, simulations or testing a die having known properly formed through-body-vias. It is appreciated that a ratio or percentage change in the pulse count which is sufficiently large to warrant a pass may vary, depending upon the particular application.

Figure 10:
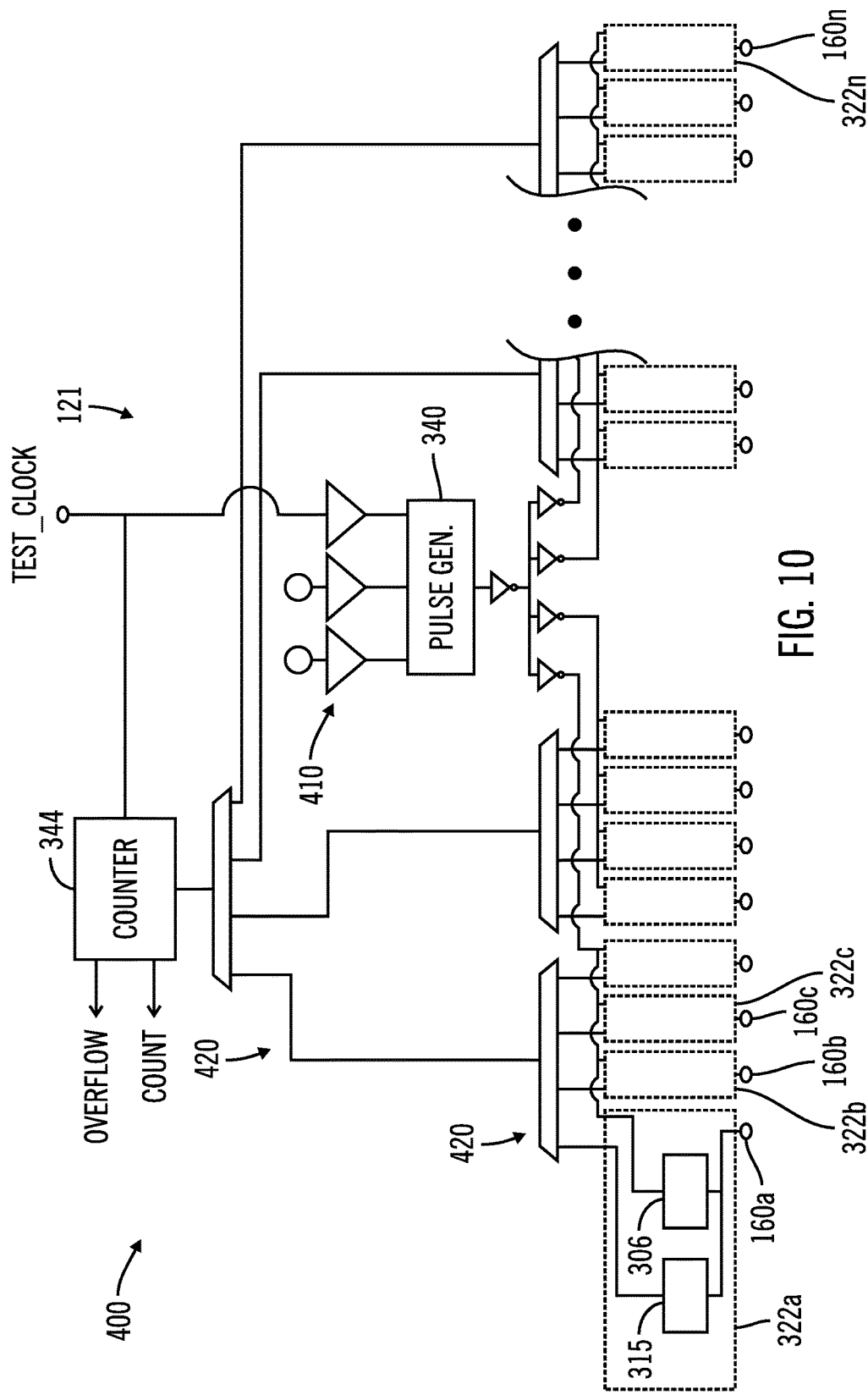
FIG. 10 illustrates another example of a through-body-via testing circuit in accordance with the present description, which includes a plurality of I/O buffers, each buffer having an associated through-body-via.

FIG. 10 shows an example of an I/O interface 400 having a through-body-via testing circuit 121 for a plurality of I/O buffers 322a, 322b . . . 322n. Each I/O buffer includes transmitter circuit such as the transmitter circuit 364 of FIG. 8, a receiver circuit such as the receiver circuit 350 of FIG. 8, and is coupled by a through-body-via such as the through-body-via 112 of FIG. 8 to an associated I/O pad 160a, 160b . . . 160n. In one embodiment, the I/O buffers 322a, 322b . . . 322n may be substantially identical. In other embodiment, the designs of the I/O buffers may differ from buffer to buffer.

As shown in FIG. 10, the I/O buffers 322a, 322b . . . 322n can share portions of the testing circuit 121. Thus, a single pulse generator circuit 340 may be provided to provide a train of control pulses similar to the train of pulses 326 shown in FIG. 9b, in response to clock signals similar to the TEST_CLOCK pulses of FIG. 9a and provided by the test controller 302 of FIG. 7a. To control the width $T_{PW}$ of each pulse, the pulse generator 340 is responsive to pulse width setting signals received at inputs 410 and provided by the test controller 302 of FIG. 7a. Thus, in those embodiments in which the I/O buffers or through-body-vias differ from buffer to buffer, a pulse width may be selected as is appropriate for that particular design.

In the illustrated embodiment, each I/O buffer has a separate pulsed current source 306 and detector circuit 315. Thus, FIG. 10 shows for example, the I/O buffer 322a having a pulsed current source 306 which provides, in response to the train of control pulses from the pulse generator 340, a train of current pulses similar to the train 330 of current pulses to drive the voltage $V_{pad}$ of the associated I/O pad 160a. The voltage level of the voltage $V_{pad}$ receiving the train of current pulses is sensed by a detector 315 and compared to a threshold voltage such as $V_{thr}$ discussed above. Although the I/O buffers each have separate pulsed current sources 306 and detectors 315 in the embodiment of FIG. 10, it is appreciated that in other embodiments, one or more pulsed current sources and detectors may be shared by the circuits having through-body-vias being tested.

The output of the detector 315 of the I/O buffer being tested may be selected by the test controller 302 controlling a selector 420 which may include, for example, one or more banks of multiplexers or other suitable selection circuitry. The output of the selected detector 315 freezes the count in the counter 344 when the voltage level $V_{pad}$ of the associated I/O pad receiving the train of current pulses as sensed by the detector 315, reaches the threshold voltage $V_{thr}$ as discussed above.

It is believed that a pulse integration test in accordance with the present description facilitates detection of defects in through-body-vias for high volume manufacturing. In addition, the tests may be relatively insensitive to process skews and variations because the testing for a particular I/O pad may be based upon a relative comparison of the same I/O pad. Still further, it is believed that power consumption or leakage resulting from the on-board circuitry may be minimized.

In addition, the I/O circuitry within an I/O interface may vary from pad to pad. Thus, testing in accordance with the present description may be applied to a variety of different types of circuits including different types of I/O buffers which are not matching buffers.

Still further, the size and complexity of the testing circuitry may be relatively reduced. Thus, in the embodiment of FIG. 10, for example, the circuitry added to each I/O buffer may be as few as a pull-up current source and a flip-flop detector. Other circuitry of the testing circuit such as a counter and a pulse generator, for example, may be shared by I/O buffers of an I/O interface. Other features may be realized in addition thereto or instead of these described herein, depending upon the particular application.

Additional Embodiment Details

The described techniques for may be embodied as a method, apparatus, computer program product or article of manufacture using standard programming and/or engineering techniques to produce software, firmware, hardware, or any combination thereof. The outputs of on-die circuitry which may include programmable processors, dedicated processors, comparators or adder/subtractor circuits, may be processed by on-die logic circuitry, firmware or software or processed by off chip logic circuitry, firmware or software, or a combination thereof, to process optically transmitted data. The term "article of manufacture" as used herein refers to code or logic embodied in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium is accessed and executed by a processor. The "article of manufacture" or "computer program product" may comprise the medium in which the code is embodied. Additionally, the "article of manufacture" "computer program product" may comprise a combination of hardware and software components in which the code is embodied, processed, and executed. Of course, those skilled in the art will recognize that many modifications may be made to this configuration without departing from the scope of the present description, and that the article of manufacture may comprise any tangible information bearing medium known in the art.

In certain applications, a die having an on board pulsed integration testing circuit in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the on board pulsed integration testing circuit die embodiments may be embodied in a computing device that does not include, for example, a video controller, such as a switch, router, etc, or does not include a network controller, for example.

The illustrated logic of FIGS. 6, 7b shows certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

Figure 11:
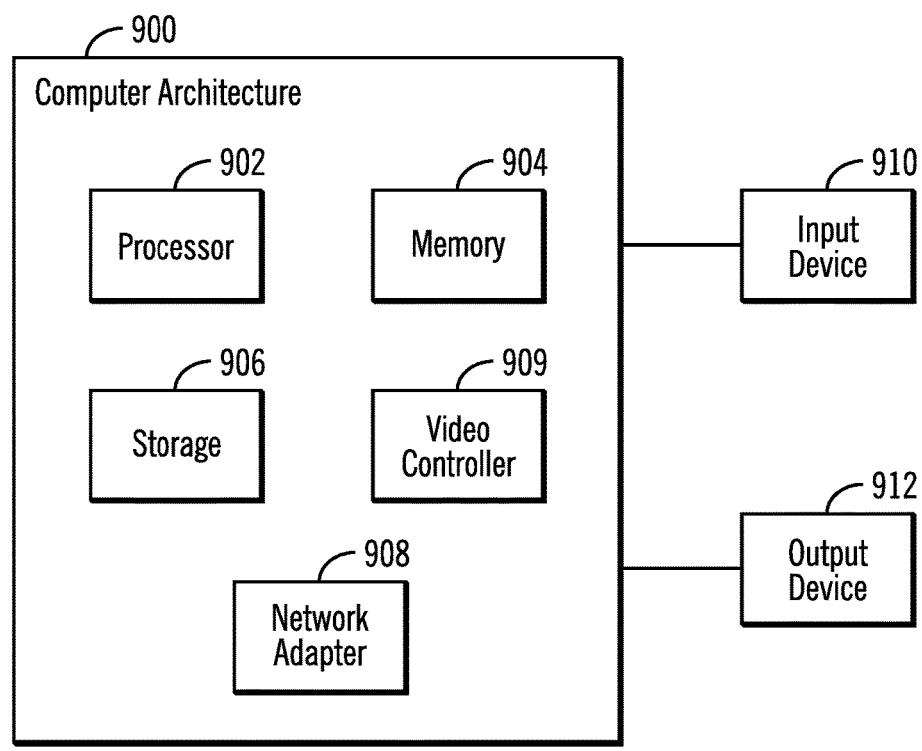
FIG. 11 illustrates an embodiment of a system utilizing a die having a through-body-via testing circuit in accordance with one embodiment of the present description.

FIG. 11 illustrates one embodiment of a computer architecture 900 of components, any one of which may include a die having an on board pulsed integration testing circuit in accordance with the present description. The computer architecture 900 may comprise any computing device known in the art, such as a mainframe, server, personal computer, workstation, laptop, handheld computer, telephony device, network appliance, virtualization device, storage controller, etc. The architecture 900 may include a processor 902 (e.g., a microprocessor), a memory 904 (e.g., a volatile memory device), and storage 906 (e.g., a non-volatile storage, such as magnetic disk drives, optical disk drives, a tape drive, etc.). The storage 906 may comprise an internal storage device or an attached or network accessible storage. Programs in the storage 906 are loaded into the memory 904 and executed by the processor 902 in a manner known in the art. The architecture further includes a network controller or adapter 908 to enable communication with a network, such as an Ethernet, a Fibre Channel Arbitrated Loop, etc. Further, the architecture may, in certain embodiments, include a video controller 909 to render information on a display monitor, where the video controller 909 may be embodied on a video card or integrated on integrated circuit components mounted on the motherboard. An input device 910 is used to provide user input to the processor 902, and may include a keyboard, mouse, pen-stylus, microphone, touch sensitive display screen, or any other activation or input mechanism known in the art. An output device 912 is capable of rendering information transmitted from the processor 902, or other component, such as a display monitor, printer, storage, etc.

The network adapter 908 may embodied on a network card, such as a Peripheral Component Interconnect (PCI) card, PCI-express, or some other I/O card, or on integrated circuit components mounted on the motherboard. The storage 906 may comprise an internal storage device or an attached or network accessible storage. Programs in the storage 906 are loaded into the memory 904 and executed by the processor 902. Any one or more of the devices of the computer architecture 900 may include one or more integrated circuits having an on-die conversion testing circuit as described herein.

The foregoing description of various embodiments has been presented for the purposes of illustration and description. It is not intended to be exhaustive or to limit to the precise form disclosed. Many modifications and variations are possible in light of the above teaching.

What is claimed is:

1. A method, comprising:
testing a node of circuitry on a wafer die having a body, a front side and a back side of the body, for defects in the node as a function of the capacitance of the node, the wafer die circuitry node testing including a first capacitance testing of the node which includes:
a first driving of pulses of current into the node;
a first comparing of the voltage of the node to a threshold voltage; and
a first counting of pulses until the voltage of the node reaches the threshold voltage to provide a first pulse count which is a function of the capacitance of the node; and
forming a through-body-via at the node, said through-body-via electrically connecting the front side of the body to the back side of the body, and
wherein the wafer die circuitry node testing includes a second capacitance testing of the node for a defect as a function of the capacitance of the node, wherein the second capacitance testing includes:
a second driving of pulses of current into the node;
a second comparing of the voltage of the node to the threshold voltage; and
a second counting of pulses until the voltage of the node reaches the threshold voltage to provide a second pulse count which is a function of the capacitance of the node after the through-body-via has been formed at the node.

2. The method of claim 1, wherein the wafer die circuitry node testing further includes determining whether the node has a defect as a function of the first pulse count which is a function of the capacitance of the node.

3. The method of claim 2, wherein the determining includes comparing the first pulse count to a reference count to determine whether the node has a defect as a function of the first pulse count which is a function of the capacitance of the node.

4. The method of claim 1, wherein the first capacitance testing of the node is performed before the through-body-via is formed such that the first pulse count is a function of the capacitance of the node before the through-body-via has been formed.

5. The method of claim 4, wherein the wafer die testing further includes comparing the first and second counts and determining whether the node has a defect after the through-body-via is formed as a function of the comparison of the first and second pulse counts.

6. The method of claim 5, wherein the determining whether the node has a defect after the through-body-via is formed includes determining whether the through-body-via has an open condition defect as a function of the comparison of the first and second pulse counts.

7. The method of claim 1, further comprising setting the width of the pulses of current in response to pulse width input signals to a pulse generator;
wherein the node is a node of an input/output buffer;
the method further comprising testing a plurality of nodes of input/output (I/O) buffer circuitry on the wafer die, for defects in each node as a function of the capacitance of each node, the wafer die circuitry node testing further including a first capacitance testing of each node which includes:
selecting a node of an I/O buffer for testing;
a first driving of pulses of current into the selected I/O buffer node;
a first comparing of the voltage of the selected I/O buffer node to a threshold voltage; and
a first counting of pulses into the selected I/O buffer node until the voltage of the selected I/O buffer node reaches the threshold voltage to provide a first pulse count for the selected I/O buffer node which is a function of the capacitance of the selected I/O buffer node; and
wherein the selecting a node of an I/O buffer for testing includes coupling the output of a detector for the selected I/O buffer node to the input of a counter wherein the detector is adapted perform said first comparing of the voltage of the selected I/O buffer node to a threshold voltage, and wherein said counter is adapter to perform said first counting of pulses until the voltage of the selected I/O buffer node reaches the threshold voltage to provide a first pulse count for the selected I/O buffer node which is a function of the capacitance of the selected I/O buffer node.

8. A device, comprising:
an integrated circuit die comprising:
a body having a front side and a back side of the body;
an integrated circuit on board the die and having a node in a first state; and
a testing circuit on board the die and adapted to test the node for defects in the node as a function of the capacitance of the node, the die circuit node testing circuit including:
a controller;
a pulsed current source responsive to the controller and having an output adapted to provide a first driving of pulses of current into the node in the first state;
a comparator coupled to the node and adapted to provide a first comparing of the voltage of the node in the first state to a threshold voltage; and
a counter responsive to the comparator and adapted to provide a first counting of pulses until the voltage of the node in the first state reaches the threshold voltage to provide a first pulse count which is a function of the capacitance of the node in the first state; and
wherein the node has a second state following the first state, and wherein the pulsed current source is responsive to the controller and adapted to provide a second driving of pulses of current into the node in the second state, the comparator is adapted to provide a second comparing of the voltage of the node in the second state to the threshold voltage, and the counter is adapted to provide a second counting of pulses until the voltage of the node in the second state reaches the threshold voltage to provide a second pulse count which is a function of the capacitance of the node in the second state.

9. The device of claim 8, further comprising logic adapted to determine whether the node in the first state has a defect as a function of the first pulse count which is a function of the capacitance of the node.

10. The device of claim 9, wherein the logic adapted to determine is further adapted to compare the first pulse count to a reference count to determine whether the node has a defect as a function of the first pulse count which is a function of the capacitance of the node.

11. The device of claim 8, wherein the node second state includes a through-body-via added to the node and wherein the node first state lacks the through-body-via added to the node in the second state.

12. The device of claim 11, further comprising logic including a comparator for comparing the first pulse count for the node in the first state, to the second pulse count for the node in the second state, said logic being responsive to the controller and adapted to determine whether the node in the second state has a defect as a function of a comparison of the first and second pulse counts which is a function of the capacitance of the node in the second state.

13. The device of claim 12, wherein the logic adapted to determine whether the node in the second state has a defect, is further adapted to determine whether the through-body-via added to the node in the second state has an open condition defect as a function of the comparison of the first and second pulse counts.

14. The device of claim 8, wherein the pulsed current source includes a current source, a pulse generator, and a switch responsive to the pulse generator and coupled to the output of the current source to provide pulses of current in response to pulses from the pulse generator, wherein the controller is adapted to provide pulse width input signals to the pulse generator and wherein the pulse generator is adapted to provide pulses of variable width in response to the pulse width input signals to the pulse generator wherein the width of the current pulses are a function of the pulse width input signals to the pulse generator;

wherein the integrated circuit is an input/output buffer and the node is a node of the input/output buffer;

wherein the integrated circuit on the die further comprises a plurality of input/output (I/O) buffers, each having a node, a pulsed current source and a comparator, and wherein the die circuit node testing circuit further includes a selector adapted to selecting a node of an I/O buffer for testing and wherein the pulsed current source of each input/output buffer is responsive to the controller and adapted to provide a first driving of pulses of current into the selected I/O buffer node, the comparator of each input/output buffer is adapted to provide a first comparing of the voltage of the selected I/O buffer node to a threshold voltage, and the counter is adapted to provide a first counting of the pulses of current into the selected I/O buffer node until the voltage of the selected I/O buffer node reaches the threshold voltage to provide a first pulse count for the selected I/O buffer node which is a function of the capacitance of the selected I/O buffer node; and wherein the selector includes logic gates adapted to selectively couple an output of the comparator for the selected I/O buffer node to an input of the counter.

15. A system, comprising:
a processor;
a memory coupled to the processor;
a video controller coupled to the processor and the memory; and
a package including an integrated circuit die coupled to the processor and the memory,
wherein the integrated circuit die comprises:
a body having a front side and a back side of the body;
an integrated circuit on board the die and having a node in a first state; and
a testing circuit on board the die and adapted to test the node for defects in the node as a function of the capacitance of the node, the die circuit node testing circuit including:
a controller;
a pulsed current source responsive to the controller and having an output adapted to provide a first driving of pulses of current into the node in the first state;
a comparator coupled to the node and adapted to provide a first comparing of the voltage of the node in the first state to a threshold voltage; and
a counter responsive to the comparator and adapted to provide a first counting of pulses until the voltage of the node in the first state reaches the threshold voltage to provide a first pulse count which is a function of the capacitance of the node in the first state; and
wherein the node has a second state following the first state, and wherein the pulsed current source is responsive to the controller and adapted to provide a second driving of pulses of current into the node in the second state, the comparator is adapted to provide a second comparing of the voltage of the node in the second state to the threshold voltage, and the counter is adapted to provide a second counting of pulses until the voltage of the node in the second state reaches the threshold voltage to provide a second pulse count which is a function of the capacitance of the node in the second state.

16. The system of claim 15, further comprising logic adapted to determine whether the node in the first state has a defect as a function of the first pulse count which is a function of the capacitance of the node.

17. The system of claim 16, wherein the logic adapted to determine is further adapted to compare the first pulse count to a reference count to determine whether the node has a defect as a function of the first pulse count which is a function of the capacitance of the node.

18. The system of claim 15, wherein the node second state includes a through-body-via added to the node and wherein the node first state lacks the through-body-via added to the node in the second state.

19. The system of claim 18, further comprising logic including a comparator for comparing the first pulse count for the node in the first state, to the second pulse count for the node in the second state, said logic being responsive to the controller and adapted to determine whether the node in the second state has a defect as a function of a comparison of the first and second pulse counts which is a function of the capacitance of the node in the second state.

20. The system of claim 19, wherein the logic adapted to determine whether the node in the second state has a defect, is further adapted to determine whether the through-body-via added to the node in the second state has an open condition defect as a function of the comparison of the first and second pulse counts.

21. The system of claim 15, wherein the pulsed current source includes a current source, a pulse generator, and a switch responsive to the pulse generator and coupled to the output of the current source to provide pulses of current in response to pulses from the pulse generator, wherein the controller is adapted to provide pulse width input signals to the pulse generator and wherein the pulse generator is adapted to provide pulses of variable width in response to the pulse width input signals to the pulse generator wherein the width of the current pulses are a function of the pulse width input signals to the pulse generator;

wherein the integrated circuit is an input/output buffer and the node is a node of the input/output buffer;

wherein the integrated circuit on the die further comprises a plurality of input/output (I/O) buffers, each having a node, a pulsed current source and a comparator, and wherein the die circuit node testing circuit further includes a selector adapted to selecting a node of an I/O buffer for testing and wherein the pulsed current source of each input/output buffer is responsive to the controller and adapted to provide a first driving of pulses of current into the selected I/O buffer node, the comparator of each input/output buffer is adapted to provide a first comparing of the voltage of the selected I/O buffer node to a threshold voltage, and the counter is adapted to provide a first counting of the pulses of current into the selected I/O buffer node until the voltage of the selected I/O buffer node reaches the threshold voltage to provide a first pulse count for the selected I/O buffer node which is a function of the capacitance of the selected I/O buffer node; and wherein the selector includes logic gates adapted to selectively couple an output of the comparator for the selected I/O buffer node to an input of the counter.

* * * * *